(12) United States Patent
Hubacek et al.

(10) Patent No.: US 8,845,855 B2
(45) Date of Patent: Sep. 30, 2014

(54) ELECTRODE FOR PLASMA PROCESSES AND METHOD FOR MANUFACTURE AND USE THEREOF

(75) Inventors: Jerome S. Hubacek, Fremont, CA (US); Albert R. Ellingboe, Co Dublin (IE); David Benzing, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 1521 days.

(21) Appl. No.: 11/878,617

(22) Filed: Jul. 25, 2007

(65) Prior Publication Data

US 2008/0026589 A1    Jan. 31, 2008

Related U.S. Application Data

(63) Continuation of application No. 09/749,916, filed on Dec. 29, 2000, now abandoned.

(51) Int. Cl.
| | | |
|---|---|---|
| *H01L 21/306* | (2006.01) | |
| *C23C 16/00* | (2006.01) | |
| *H01J 37/32* | (2006.01) | |

(52) U.S. Cl.
CPC ....... *H01J 37/32009* (2013.01); *H01J 37/3255* (2013.01)
USPC ............. 156/345.43; 156/345.47; 118/723 E; 118/715

(58) Field of Classification Search
USPC ........... 118/715, 723 E, 723 ER; 156/345.43, 156/345.46, 345.47
See application file for complete search history.

(56) References Cited

U.S. PATENT DOCUMENTS

| | | |
|---|---|---|
| 4,340,462 A | 7/1982 | Koch et al. |
| 4,595,484 A | 6/1986 | Giammarco et al. |
| 4,792,378 A | 12/1988 | Rose et al. |
| 4,820,371 A | 4/1989 | Rose |
| 4,960,488 A | 10/1990 | Law et al. |
| 5,074,456 A | 12/1991 | Degner et al. |
| 5,569,356 A | 10/1996 | Lenz et al. |
| 5,853,523 A | 12/1998 | Machida et al. |
| 5,865,896 A | 2/1999 | Nowak et al. |
| 5,993,596 A | 11/1999 | Uwai et al. |
| 5,993,597 A | 11/1999 | Saito et al. |
| 6,036,877 A | 3/2000 | Collins et al. |
| 6,036,878 A | 3/2000 | Collins |
| 6,073,577 A | 6/2000 | Lilleland et al. |

FOREIGN PATENT DOCUMENTS

| | | |
|---|---|---|
| EP | 0817236 A2 | 1/1998 |
| EP | 0821397 A2 | 1/1998 |
| EP | 0885859 A2 | 12/1998 |
| JP | 2-20018 | 1/1990 |
| JP | 07211700 | 8/1995 |
| JP | 09245994 | 9/1997 |
| WO | WO00/68985 | 11/2000 |

OTHER PUBLICATIONS

Notification of Transmittal of the International Search Report or the Declaration for PCT/US01/44701, dated Jun. 5, 2002.
Written Opinion dated Aug. 12, 2002 for PCT/US01/44701.
Wolf et al., "Silicon Processing for the VLSI Era", 1986, Lattice Press, vol. 1, pp. 119-120.

*Primary Examiner* — Luz Alejandro Mulero
(74) *Attorney, Agent, or Firm* — Buchanan Ingersoll & Rooney PC

(57) ABSTRACT

A silicon electrode for a plasma reaction chamber wherein processing of a semiconductor substrate such as a single wafer can be carried out and a method of processing a semiconductor substrate with the electrode. The electrode is a low resistivity electrode having an electrical resistivity of less than 1 ohm-cm. The electrode can be a zero defect single crystal silicon or silicon carbide electrode such as a showerhead electrode bonded or clamped to support such as a temperature controlled plate or ring. The showerhead electrode can be in the form of a circular disk of uniform thickness and an elastomeric joint can be provided between a support ring and the electrode. The electrode can include gas outlets having 0.020 to 0.030 inch diameters.

8 Claims, 3 Drawing Sheets

ELECTRODE FOR PLASMA PROCESSES AND METHOD FOR MANUFACTURE AND USE THEREOF

CROSS-REFERENCE TO RELATED APPLICATIONS

This application is a continuation application of U.S. application Ser. No. 09/749,916 entitled ELECTRODE FOR PLASMA PROCESS AND METHOD FOR MANUFACTURE AND USE THEREOF, filed on Dec. 29, 2000, which is now abandoned.

BACKGROUND OF THE INVENTION

1. Field of the Invention

The invention relates to an apparatus for plasma processing of semiconductor substrates such as silicon wafers, and more particularly, to an electrode assembly having a low resistivity electrode. The invention also relates to processing semiconductor substrates with the electrode assembly.

2. Description of the Related Art

Electrodes used in plasma processing reactors for processing semiconductor substrates such as silicon wafers are disclosed in U.S. Pat. Nos. 5,074,456 and 5,569,356, the disclosures of which are hereby incorporated by reference. The '456 patent discloses an electrode assembly for a parallel plate reactor apparatus wherein the upper electrode is of semiconductor purity and bonded to a support frame by adhesive, solder, or brazing layer. The soldering or brazing layer can be low vapor pressure metals such as indium, silver and alloys thereof and the bonded surfaces of the support frame and the electrode can be coated with a thin layer of metal such as titanium or nickel to promote wetability and adhesion of the bonding layer. It has been found that metallurgical bonds such as In bonds cause the electrode to warp due to differential thermal expansion/contraction of the electrode and the part to which the electrode is bonded. It has also been found that these metallurgical bonds fail at high plasma processing powers due to thermal fatigue and/or melting of the bond.

Dry plasma etching, reactive ion etching, and ion milling techniques were developed in order to overcome numerous limitations associated with chemical etching of semiconductor wafers. Plasma etching, in particular, allows the vertical etch rate to be made much greater than the horizontal etch rate so that the resulting aspect ratio (i.e., the height to width ratio of the resulting notch) of the etched features can be adequately controlled. In fact, plasma etching enables very fine features with high aspect ratios to be formed in films over 1 micrometer in thickness.

During the plasma etching process, a plasma is formed above the masked surface of the wafer by adding large amounts of energy to a gas at relatively low pressure, resulting in ionizing the gas. By adjusting the electrical potential of the substrate to be etched, charged species in the plasma can be directed to impinge substantially normally upon the wafer, wherein materials in the unmasked regions of the wafer are removed.

The etching process can often be made more effective by using gases that are chemically reactive with the material being etched. So called "reactive ion etching" combines the energetic etching effects of the plasma with the chemical etching effect of the gas. However, many chemically active agents have been found to cause excessive electrode wear.

It is desirable to evenly distribute the plasma over the surface of the wafer in order to obtain uniform etching rates over the entire surface of the wafer. For example, U.S. Pat. Nos. 4,595,484, 4,792,378, 4,820,371, 4,960,488 disclose showerhead electrodes for distributing gas through a number of holes in the electrodes. These patents generally describe gas distribution plates having an arrangement of apertures tailored to provide a uniform flow of gas vapors to a semiconductor wafer.

A reactive ion etching system typically consists of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$ and $SF_6$ or mixtures thereof with $O_2$, $N_2$, He or Ar is introduced into the etching chamber and maintained at a pressure which is typically in the millitorr range. The upper electrode is provided with gas holes which permit the gas to be uniformly dispersed through the electrode into the chamber. The electric field established between the anode and the cathode will dissociate the reactive gas forming a plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched side walls.

SUMMARY OF THE INVENTION

The invention provides a low resistivity silicon electrode adapted to be mounted in a plasma reaction chamber used in semiconductor substrate processing. The electrode has an electrical resistivity of less than 1 ohm-cm and an RF driven or electrically grounded surface on one side thereof, the surface being exposed to plasma in the plasma reaction chamber during use of the electrode. Preferably, the resistivity is less than 0.1 ohm-cm, more preferably less than 0.05 ohm-cm.

According to a preferred embodiment of the invention, the electrode can comprise a showerhead electrode having a plurality of gas outlets arranged to distribute process gas in the plasma reaction chamber during use of the showerhead electrode, e.g., the gas outlets can have diameters of 0.020 to 0.030 inch and the gas outlets are distributed across the exposed surface. The electrode preferably comprises zero defect single crystal silicon having heavy metal contamination of less than 10 parts per million. According to a preferred use, the electrode can comprise an electrically grounded upper electrode of a parallel plate plasma reactor.

The electrode can be installed as part of an electrode assembly in a plasma etch reactor. For instance, the electrode can be bonded to a support member by an elastomeric joint, the elastomeric joint comprising an electrically conductive elastomeric material between the electrode and the support member, the elastomeric material providing an electrical current path between the electrode and the support member. In another arrangement, the electrode can be resiliently clamped to a support member by a clamping member. If desired, the electrode can be a showerhead electrode bonded or clamped to a temperature-controlled member in an interior of a plasma reaction chamber wherein the temperature-controlled member includes a gas passage supplying a process gas to the showerhead electrode. In such an arrangement, the temperature-controlled member can include a cavity and at least one baffle plate located in the cavity such that the gas passage supplies process gas which passes through the baffle prior to passing through the showerhead electrode.

The invention also provides a method of processing a semiconductor substrate in a plasma reaction chamber wherein an electrode assembly includes an RF driven or electrically grounded silicon electrode having a resistivity of less than 1 ohm-cm. The method includes supplying a semiconductor substrate to the plasma reaction chamber, supplying process gas to an interior of the plasma reaction chamber, energizing the process gas to form a plasma in contact with an exposed surface of the semiconductor substrate, and processing the substrate with the plasma.

In a preferred embodiment, the semiconductor substrate comprises a silicon wafer and the method includes etching a dielectric or conductive layer of material on the wafer. Alternatively, the method can include depositing a layer of material on the semiconductor substrate. The electrode can comprises an upper electrode in a parallel plate plasma reactor. In the case where the upper electrode is grounded, the lower electrode can be supplied RF energy of at least one frequency during processing of the substrate.

In a preferred plasma etching process, the electrode can comprise an RF driven single crystal silicon showerhead electrode bonded or clamped to a temperature-controlled member through which the process gas is supplied to the showerhead electrode. The RF driven electrode can form the plasma by energizing the process gas and the substrate can comprise a silicon wafer which is subjected to etching by the plasma. The electrode can also comprise an electrically grounded, non-powered single crystal silicon showerhead electrode bonded or clamped to a temperature-controlled member through which the process gas is supplied to the showerhead electrode. The grounded showerhead electrode can provide a ground path effective to confine the plasma and the substrate can comprise a silicon wafer which is subjected to etching by the plasma.

In use, the electrode according to the invention can couple RF power into the plasma more efficiently and with less heat-up compared to a conventional electrode having an electrical resistivity of 10 ohm-cm or higher. Further, in the case where the electrode according to the invention includes gas outlets through which the process gas passes into the chamber wherein the gas outlets have diameters of 0.020 to 0.030 inch and the process gas comprises an etchant gas, the electrode can exhibit less build-up of polymer byproducts within the gas outlets and on a backside of the electrode during etching of the substrate with the etchant gas compared to a conventional electrode having 0.033 inch diameter gas outlets.

BRIEF DESCRIPTION OF THE DRAWINGS

The invention will now be further described with reference to the figures, wherein.

DETAILED DESCRIPTION OF THE INVENTION

The invention provides a low resistivity silicon electrode which has advantages over conventional higher resistivity electrodes used in plasma reactors by providing improved impedance to ground which improves plasma confinement, improved plasma processing such as increased etching rate while maintaining etch rate uniformity, and/or improved temperature control by minimizing heat-up and reducing ohmic losses whereby power can be more efficiently coupled into the plasma.

It has been found that the silicon electrode according to the invention provides unexpected improvement in plasma processing of semiconductor substrates such as silicon wafers, particularly during plasma etching compared to conventional electrodes. For purposes of explanation, the electrode according to the invention will be described with reference to a showerhead electrode useful in plasma processing of semiconductor substrates.

According to a preferred embodiment of the invention, a low resistivity electrode is used as an upper electrode of a parallel plate plasma reactor for processing a semiconductor substrate, e.g., an upper electrode of a single wafer etcher wherein a wafer such as a 200 mm or 300 mm silicon wafer is supported on an electrostatic chuck having a flat bottom electrode on which the wafer is supported 1 to 2 cm below the upper electrode. In such systems, the electrode can be part of an electrode assembly which must be replaced periodically. Thus, the electrode or electrode assembly is mounted in a manner facilitating removal from the plasma chamber. For instance, the electrode can be mechanically clamped to a support by any suitable technique such as that described in commonly owned U.S. Pat. No. 5,569,356 to Lenz et al., the disclosure of which is hereby incorporated by reference. Alternatively, the electrode can be metallurgically or adhesively bonded to a support by any suitable technique such as that described in commonly owned U.S. Pat. No. 5,074,456 to Degner et al., the disclosure of which is hereby incorporated by reference. Still yet, the electrode can be bonded to a support by an elastomeric joint such as that described in commonly owned U.S. Pat. No. 6,073,577 to Lilleland et al., the disclosure of which is hereby incorporated by reference.

Figure 1:
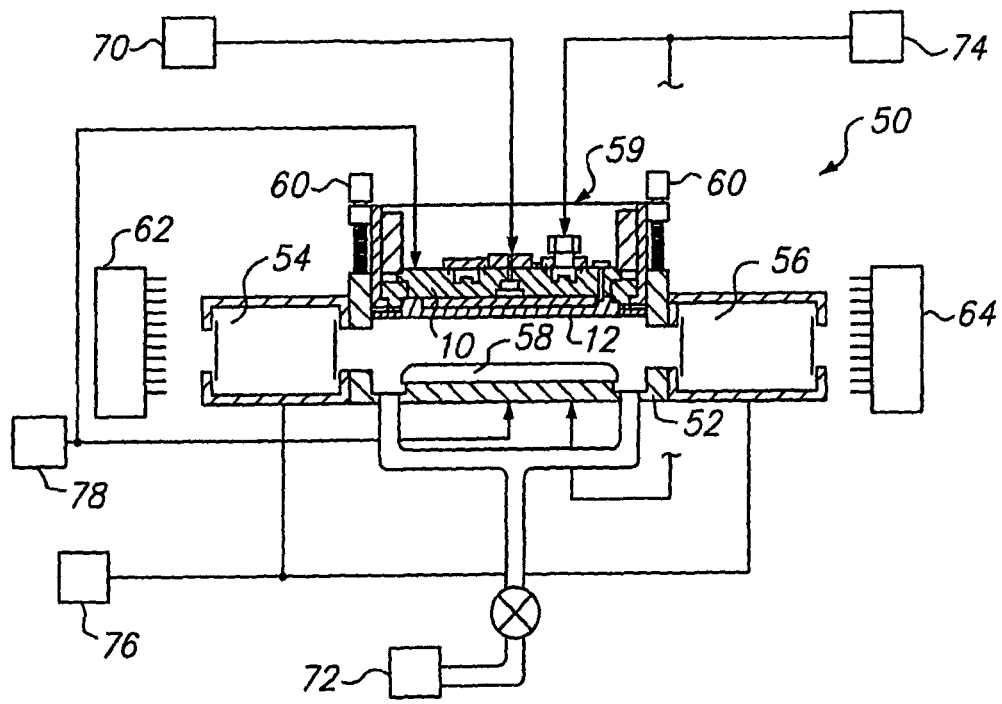
FIG. 1 is a schematic illustration of a plasma reactor system in which the low resistivity electrode according to the invention can be used.

The low resistivity electrode according to the invention can be used in the plasma etch system illustrated in FIG. 1 wherein an electrode assembly 10 including an upper electrode 12 is located in a parallel plate reactor system 50 having a chamber 52, an inlet load lock 54, and an outlet load lock 56, details of which can be found in commonly owned U.S. Pat. No. 4,340,462, the disclosure of which is hereby incorporated by reference. The chamber 52 includes a lower electrode plate 58 which is adapted to receive a single wafer substrate on its upper surface. The electrode assembly 10 is mounted in an upper housing 59 which can be moved vertically by a mechanism 60 whereby the gap between electrode 12 and electrode 58 can be adjusted.

The load locks 54 and 56 include transfer devices to transfer wafers from a wafer supply 62 through the chamber 52 and out to a wafer receptacle 64. An etchant gas supply 70 is connected to the housing 59 to deliver etchant gas to the electrode assembly 10. A vacuum pump arrangement 72 maintains a desired vacuum in the chamber, e.g., 0.001 to 10 Torr. A cooling water source 74 is connected to the upper and lower electrodes to maintain them at desired temperatures and a load lock pump arrangement 76 provides a desired vacuum pressure in the load locks 54 and 56. A power source 78 provides radio frequency (RF) power to the upper and/or lower electrodes 12 and 58.

Figure 2:
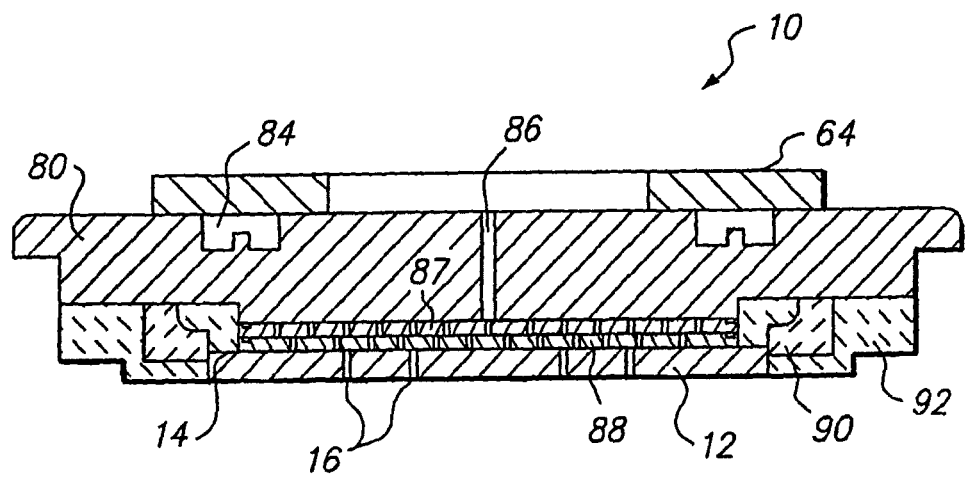
FIG. 2 is a side sectional view of a low resistivity showerhead electrode assembly according to a first embodiment of the present invention.

Details of the electrode assembly 10 are shown in FIG. 2 wherein an electrode plate 12 in the form of a disk is bonded to a support ring 14 by a suitable bonding technique such as brazing, soldering, adhesives or the like. The electrode comprises a showerhead electrode which includes apertures 16 to distribute a reactant gas therethrough. The ring 14 includes a flange and extension sized to engage the upper surface of the showerhead 12. The ring 14 is secured to an electrically conductive backing plate 80 such as an aluminum plate via fasteners (not shown) and a cooling channel 84 covered by plate 64 forms a cooling duct for circulation of cooling water supplied by source 74. RF power from source 78 can be supplied to the plate 80 and conducted through the ring 14 to the plate 12 for energizing plasma in the chamber 52. Alternatively, the electrode 12 can be grounded to provide a ground path for plasma generated in the chamber by the lower electrode 58. Reactant gas from source 70 enters the plate 80 through passage 86 and then passes into a baffle arrangement which includes baffle plates 87 and 88. While two baffle plates are shown, any suitable baffle arrangement can be used or omitted. Surrounding the ring 14 is an inner insulating or conductive ring 90 and an outer insulating ring 92, both of which protect the ring 14 from direct contact with the plasma.

Figure 3:
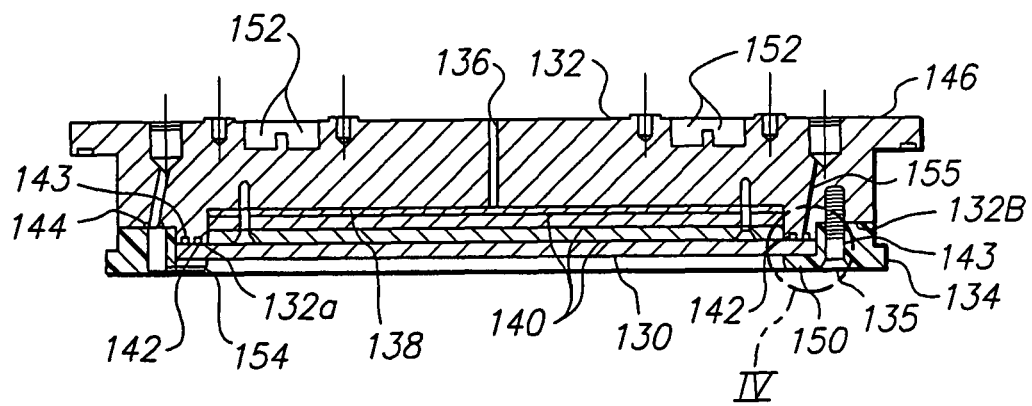
FIG. 3 is a side sectional view of a low resistivity showerhead electrode assembly according to a second embodiment of the present invention.
Figure 4:
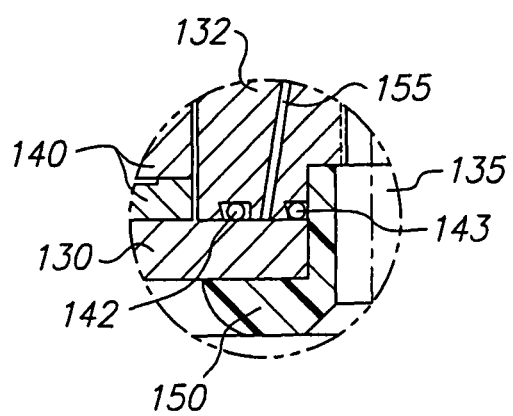
FIG. 4 is a side sectional view of a detail IV of the arrangement shown in FIG. 3.

The low resistivity electrode according to the invention can be used in the captive electrode system shown in FIGS. 3-4 wherein the electrode assembly includes an electrode 130, a support member 132, and a plasma confinement ring 134 clamping the electrode to the member 132. The ring 134 is attached to the member 132 by bolts 135 threaded into member 132. The member 132 includes gas passage 136 to provide process gas to a recess 138 containing three baffle plates 140. A lower surface 132a of member 132 engages electrode 130 to supply RF power thereto and a radially outer surface 132b of member 132 contacts an upper surface of ring 134. A flange 146 of member 132 allows attachment of the electrode assembly to the interior of a plasma reaction chamber. Cooling channels 152 in member 132 allow cooling of the electrode assembly. A flange 150 on ring 134 provides a resilient clamping force against an outer portion of the exposed surface of the electrode 130. The confinement ring 134 is preferably fabricated from a dielectric material such as a heat resistant thermoset polymer (e.g., Vespel™ made by Dupont) which is stable in a plasma environment or the ring can be made from ceramic materials such as alumina, zirconia, titania, silicon nitride, silicon carbide, etc. or a dielectric coated metal can be used for the ring 134. If the ring is of an inelastic material, the bolts 135 can be made of an elastically deformable material such as Vespel™ to provide the resilient clamping force on the electrode 130. Alternatively, the ring 134 and the bolts can be made of elastically deformable material. Details of suitable clamping arrangements are provided in the Lenz et al. patent incorporated by reference above.

Pressure in the plasma reaction chamber can be monitored via gas passage 154 in ring 134. O-ring 144 surrounding passage 154 provides a seal between member 132 and ring 134. To enhance thermal conduction between electrode 130 and member 132, process gas can be supplied through passage 155 and maintained under pressure in an annular channel (not shown) in member 132 and O-ring seals 142 and 143 can be used to maintain gas under pressure in the channel.

Figure 5:
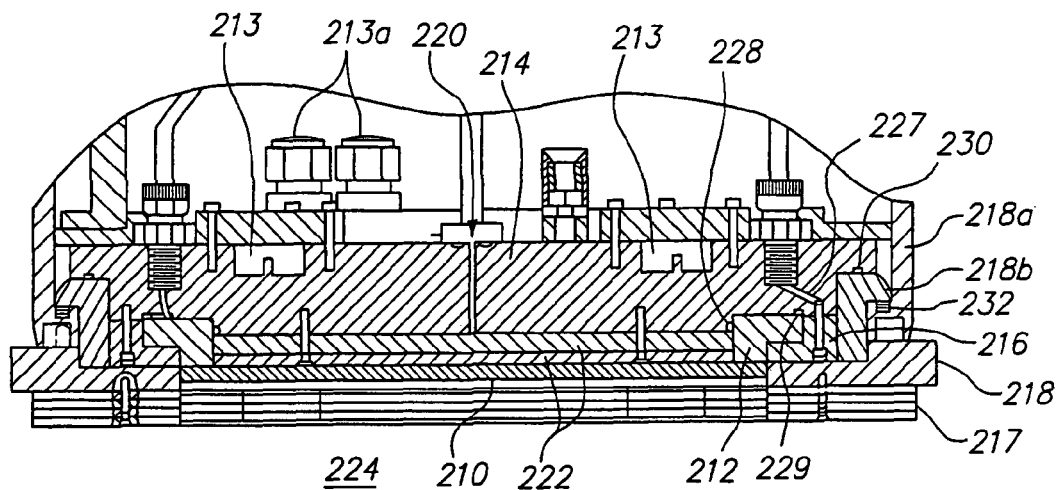
FIG. 5 is a side sectional view of a low resistivity showerhead electrode assembly according to a third embodiment of the present invention.
Figure 6:
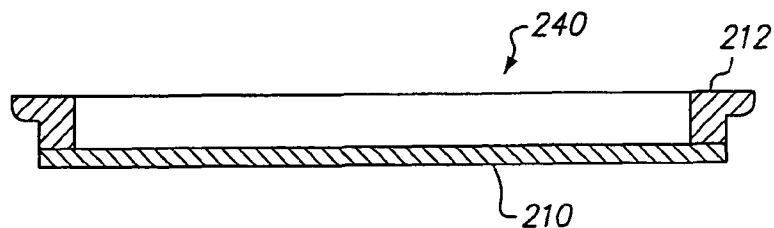
FIG. 6 shows details of the electrode assembly shown in FIG. 5.
Figure 7:
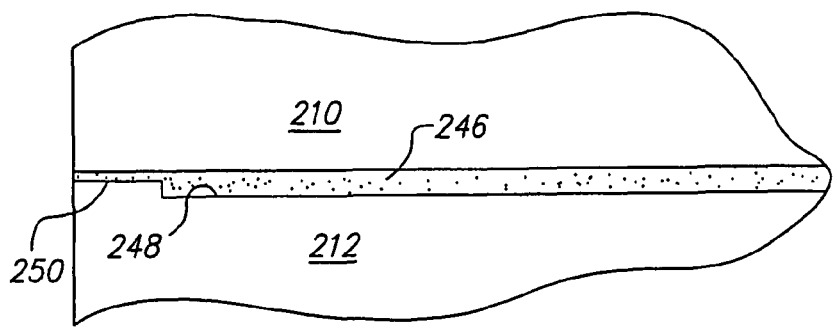
FIG. 7 is a side sectional view of a portion of the arrangement shown in FIG. 3.

With reference to FIGS. 5-7, a low resistivity electrode 210 according to the invention can be bonded to a support ring 212 by an elastomeric joint 246. As shown in FIGS. 5-6, the electrode 210 is a planar disk having uniform thickness from center to edge thereof. An outer flange on ring 212 is clamped by an aluminum clamping ring 216 to an aluminum temperature-controlled member 214 having water cooling channels 213. Water is circulated in the cooling channels 213 by water inlet/outlet connections 213a. A plasma confinement ring 217 comprised of a stack of spaced-apart quartz rings surrounds the outer periphery of electrode 210. The plasma confinement ring 217 is bolted to a dielectric annular ring 218 which in turn is bolted to a dielectric housing 218a. The purpose and function of confinement ring 217 is to cause a pressure differential in the reactor and increase the electrical resistance between the reaction chamber walls and the plasma thereby confining the plasma between the upper and lower electrodes. A radially inwardly extending flange of clamping ring 216 engages the outer flange of graphite support ring 212. Thus, no clamping pressure is applied directly against the exposed surface of electrode 210.

Process gas from a gas supply is supplied to electrode 210 through a central hole 220 in the temperature-controlled member 214. The gas then is distributed through one or more vertically spaced apart baffle plates 222 and passes through gas distribution holes (not shown) in the electrode 210 to evenly disperse the process gas into reaction chamber 224. In order to provide enhanced heat conduction from electrode 210 to temperature-controlled member 214, process gas can be supplied to fill open spaces between opposed surfaces of temperature-controlled member 214 and support ring 212. In addition, gas passage 227 connected to a gas passage (not shown) in the annular ring 218 or confinement ring 217 allows pressure to be monitored in the reaction chamber 224. To maintain process gas under pressure between temperature-controlled member 214 and support ring 212, a first O-ring seal 228 is provided between an inner surface of support ring 212 and an opposed surface of temperature-controlled member 214 and a second O-ring seal 229 is provided between an outer part of an upper surface of support ring 212 and an opposed surface of member 214. In order to maintain the vacuum environment in chamber 224, additional O-rings 230, 232 are provided between temperature-controlled member 214 and cylindrical member 218b and between cylindrical member 218b and housing 218a.

FIG. 6 shows further details of a showerhead assembly 240 wherein electrode 210 is bonded to electrically conductive support ring 212 by an elastomeric joint 246 which can be located in a recess 248, as shown in FIG. 7. The recess 248 preferably extends continuously around the support ring 212 between an inner wall (not shown) and an outer wall 250 of the support ring 212. Each wall 250 can be as thin as possible, e.g. about 30 mils wide, which allows the elastomer to form a thin layer (e.g. about 2 μm thick in the case where the elastomer includes 0.7 to 2 μm sized filler such as conductive particles of aluminum, silicon, silicon carbide, or the like) in the area in contact with each wall 250 and a thicker layer (e.g. about 0.0025 inch) in the recess 248. The recess formed by the walls can be extremely shallow, e.g. about 2 mils deep, which provides a very thin elastomeric joint having enough strength to adhesively bond the electrode to the support ring yet allow movement of the electrode relative to the support ring during temperature cycling of the electrode assembly. Additionally, the walls of the recess can protect the elastomeric joint from attack by the plasma environment in the reactor. It should be noted that the recess 248 can be omitted and the elastomer bond can be provided as isolated or continuous thin beads of elastomer between mating planar surfaces of the electrode and a support member, e.g., the elastomer can be deposited as one or more thin annular beads between the electrode and a support member.

Conventional showerhead electrodes have been made from single crystal silicon having a resistivity of 10 ohm-cm or higher. While such electrodes have performed well in plasma etch reactors, it has been discovered that performance of such electrodes can be unexpectedly improved by lowering the resistivity of the electrodes. For instance, according to the invention, the resistivity of the electrode is reduced to less than 1 ohm-cm, preferably 0.005 to 0.02 ohm-cm. The material of the electrode is preferably zero defect single crystal silicon which is used for making silicon wafers. In addition, other materials such as low resistivity silicon carbide can also be used for the electrode.

According to one embodiment of the invention, the electrode comprises a grounded showerhead electrode in a plasma reactor wherein the plasma is generated by a lower electrode incorporated in the substrate support. If desired, the lower electrode can be supplied dual frequency power wherein a higher frequency is used to generate and sustain the plasma used to process a wafer and a lower frequency is used to apply a desired RF bias to the wafer. Compared to a conventional silicon electrode and using the same process parameters, the low resistivity electrode according to the invention can provide an etch rate which is unexpectedly increased by 5 to 10% while maintaining etch rate uniformity.

The improved etch rate achievable with the low resistivity electrode in accordance with the invention may be the result of an improved low impedance path for RF grounding/coupling in the plasma reactor. Also, the confinement window (i.e., process conditions such as chamber pressure and power supplied to the electrode) can be improved using the low resistivity electrode. For example, in the Exelan™ and Exelan HP™ reactors manufactured by LAM Research Corporation (the assignee of the present application) wherein the low resistivity electrode is a grounded upper showerhead electrode, the low resistivity electrode can improve the confinement window significantly compared to the previously used electrode having a resistivity of 10 to 20 ohm-cm. The improved etch rate can also be achieved when the electrode is used as a powered upper showerhead electrode in reactors such as the 4520XLe™ manufactured by LAM Research Corporation.

Low resistivity electrodes absorb less power from the RF current passing through them due to $I^2R$ losses than higher resistivity electrodes. This results in more power being available to be absorbed by the plasma for a given RF generator power output. The additional power output delivered to the plasma may be responsible for the improved etch rate achieved with the low resistivity electrode according to the invention. Also, the decreased power loss may reduce the electrode temperature which can thus reduce wear of the electrode and extend the useful life of the electrode until it needs to be replaced.

The conventional electrodes used in the Exelan™, Exelan HP™ and 4520XLe™ reactors can be elastomer bonded to support rings and mounted in the reactors as replaceable electrode assemblies. The low resistivity electrodes according to the invention can be mounted in the same manner or they can be mounted by other suitable arrangements such as by mechanical clamping arrangements or other bonding techniques such as adhesives, solders or brazing compositions.

The following exemplary embodiments are provided for purposes of illustrating suitable low resistivity electrodes in accordance with the invention. It will be apparent to those skilled in the art that other electrode designs will also be suitable for the electrode in accordance with the invention.

During manufacture of a low resistivity showerhead electrode according to the invention, it is desirable to remove damage inside holes created during ultrasonic drilling of the holes. Such damage can be removed by etching in a strong acid and polishing the electrode. This allows faster conditioning of the electrode after installation in a plasma reactor. Also, the electrode can be cleaned faster during a periodic wet clean recovery process, i.e., after processing a certain number of wafers. Another advantage exhibited by the electrode is that it exhibits improved wear characteristics compared to a conventional electrode.

In order to reduce polymer deposition behind the showerhead during plasma etching, the through holes can be made smaller than in a conventional electrode whereby the back pressure behind the electrode can be increased to reduce backstreaming. Further, the smaller size holes reduces the possibility of plasma discharge in the holes and behind the showerhead. The smaller holes can also reduce polymer deposition on a baffle plate adjacent the showerhead and/or on the backside of the showerhead. Compared to a conventional showerhead electrode having 0.033 inch diameter holes, the low resistivity showerhead can be made with holes smaller than 0.030 inch, e.g., 0.020 to 0.028 inch, preferably 0.025 inch diameter holes.

To further reduce polymer buildup, the number of holes can be reduced compared to a conventional showerhead. For example, the number of holes can be reduced by 50% or more, e.g., by 20 to 40%, preferably by 25%. Thus, if a conventional showerhead has 2000 to 4000 holes, the low resistivity showerhead can have 500 to 1000 holes in the case of a showerhead for processing a 200 mm wafer. As an example, a conventional electrode may have around 3250 holes compared to the low resistivity electrode which can have around 830 holes. With the reduced number of holes, the showerhead can be expected to last longer in that it will take longer times for the plasma to erode the electrode such that the holes are bridged.

The low resistivity electrode can reduce center-to-edge temperature variation across the electrode and thereby obtain better process uniformity. Such reduction in temperature variation can be enhanced by making the electrode thicker than conventional electrodes or by assembling the electrode into an assembly which achieves better heat conduction to a temperature controlled member. For example, the electrode can have an increased thickness of 0.375 or even 0.50 inch compared to a conventional 0.25 inch thick electrode. Also, the electrode can be backed with a backing member and attached to a support assembly of a support ring such as a graphite ring and a baffle arrangement. With such an arrangement, the electrode can be backed with a backing plate made of a suitable heat conducting material such as aluminum or alloy thereof, SiC, graphite or the like, and the backing plate can be bolted to the support assembly. The backing plate can also provide the electrode with good RF conductivity to minimize voltage potential differences in the showerhead electrode area of the plasma chamber. The backing plate can be attached to the electrode by any suitable manner including bonding such as by an elastomer bond.

The low resistivity electrode can provide a better DC conductivity path compared to a conventional electrode. Thus, by improving the DC conductivity path, plasma confinement can also be improved.

In the following, a low resistivity electrode in accordance with the invention having gas outlets 0.025 inch in diameter is compared to a conventional single crystal silicon electrode having a thickness of 0.25 inch, a resistivity of 10 to 20 ohm-cm and gas outlets 0.033 inch in diameter. The low resistivity electrode had a thickness of 0.25 inch and was made of single crystal silicon doped with boron to achieve a resistivity of 0.005 to 0.02 ohm-cm. Such low resistivity silicon can be obtained as grown single crystal, zero-defect silicon from Bullen Ultrasonics located in Eaton, Ohio. Whereas a conventional electrode has several thousand gas outlets, the low resistivity electrode can be provided with fewer gas outlets (e.g., less than 1000) of smaller diameter thus extending the life of the electrode in terms of the time over which the holes are bridged due to erosion by the plasma. Such holes can be drilled ultrasonically using a slurry and the electrode can be cleaned in strong acid to remove drilling damage, lapped with SiC abrasive and polished to reduce conditioning time normally required prior to using the installed electrode to process wafers in a plasma etch chamber.

The following table sets forth test results comparing the low resistivity silicon electrode according to the invention having a resistivity of less than 1 ohm-cm to a higher resistivity silicon electrode having a resistivity of 10 ohm-cm or higher. In the tests, features such as contacts, vias and spacers were etched using the same gas chemistry and reactor conditions.

| Feature | Gas | CE ER | CE U | IE ER | IE U | ERΔ |
|---|---|---|---|---|---|---|
| contact | $C_xF_y$/Ar/N/O | 5513.1 | 2.03 | 5790.4 | 2.33 | +5 |
| via | $C_xF_y$/Ar/CO/O | 5082 | 1.94 | 5531.3 | 1.61 | +8.8 |
| spacer | $C_xF_y$/Ar/O | 895 | 2.7 | 959 | 1.5 | +7.1 |

CE: conventional electrode
IE: inventive electrode
ER: etch rate (Å/min)
U: uniformity (%)
ERΔ: change in etch rate (%)

The electrode according to the invention can be used as a showerhead electrode for etching semiconductor wafers. If desired, however, the electrode assembly can have other arrangements wherein the electrode is not a showerhead electrode and/or the support member can be in forms other than a ring. For instance, the electrode could be a showerhead electrode bonded to a backing plate having gas distribution holes communicating with those in the electrode. Another possibility is where the electrode is bonded to a support member in the form of a plate, cylinder, projections on a base member, etc. Further, the electrode can be free of gas outlets in the case where the electrode is a grounded or powered electrode in a plasma chamber.

The electrode preferably consists of an electrically conductive material such as a planar silicon (e.g., single crystal silicon) or silicon carbide electrode disc having uniform thickness from the center to the outer edge thereof. However, electrodes having nonuniform thickness, different materials and/or without process gas distribution holes could also be used with the electrode assembly according to the invention. In a preferred embodiment, the electrode is a showerhead electrode provided with a plurality of spaced apart gas discharge passages which are of a size and distribution suitable for supplying a process gas which is energized by the electrode and/or another electrode or energy source into a plasma in the reaction chamber. However, the electrode according to the invention can be used as any type of electrode useful in a plasma reactor or vacuum environment, such electrodes including sputter electrodes.

The electrode according to the invention can be used for wafer processing such as plasma etching, deposition, etc., in multiple or single wafer processing. For instance, the electrode can be used for etching or depositing BPSG, oxides such as thermal silicon dioxide or pyrolytic oxides and photoresist materials. The apparatus can maintain desirable levels of submicron contact profile, CDs and low particle contamination. With respect to etching BPSG, etch rates on the order of about 3000 Å/min can be achieved and etch uniformity can be maintained at around 3%.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A low resistivity silicon electrode adapted to be mounted in a plasma reaction chamber including a confinement ring which is used in semiconductor substrate processing, comprising:
    a silicon electrode comprising a showerhead electrode having 500 to 1000 gas outlets having diameters of 0.025 to 0.030 inch and arranged to distribute process gas in the plasma reaction chamber during use of the showerhead electrode,
    wherein
        the electrode has a thickness of about 0.25 inch to 0.35 inch and an electrical resistivity of about 0.005 to 0.02 ohm-cm,
        the electrode has an RF driven or electrically grounded surface on one side thereof, the surface being exposed to plasma in the plasma reaction chamber during use of the electrode, and
        the electrode comprises single crystal silicon or silicon carbide having heavy metal contamination of less than 10 parts per million.

2. The electrode of claim 1, wherein the electrode comprises an electrically grounded upper electrode of a parallel plate plasma reactor.

3. A plasma etch reactor having an electrode assembly which includes the electrode of claim 1, the electrode being bonded to a support member by an elastomeric joint, the elastomeric joint comprising an electrically conductive elastomeric material between the electrode and the support member, the elastomeric material including an electrically conductive filler which provides an electrical current path between the electrode and the support member.

4. A plasma etch reactor having an electrode assembly which includes the electrode of claim 1, the electrode being resiliently clamped to a support member by a clamping member.

5. A plasma reaction chamber including the showerhead electrode of claim 1, the showerhead electrode being bonded or clamped to a temperature-controlled member in an interior of the plasma reaction chamber, the temperature-controlled member including a gas passage supplying a process gas to the showerhead electrode, the temperature-controlled member including a cavity and at least one baffle plate located in the cavity, the gas passage supplying process gas so as to pass through the baffle prior to passing through the showerhead electrode.

6. The electrode of claim 1, wherein the gas outlets have diameters of from 0.025 to 0.028 inches.

7. The electrode of claim 1, wherein the gas outlets have diameters of 0.025 inch.

8. The electrode of claim 1, wherein the showerhead is adapted to be mounted in a plasma reaction chamber configured to process a 200 mm-300 mm wafer.

* * * * *